United States Patent [19]

Crafts

[11] Patent Number: 4,745,305
[45] Date of Patent: May 17, 1988

[54] COMMON CELL I/O INTERFACE CIRCUIT

[75] Inventor: Harold S. Crafts, Fort Collins, Colo.

[73] Assignee: NCR Corporation, Dayton, Ohio

[21] Appl. No.: 779,379

[22] Filed: Sep. 23, 1985

[51] Int. Cl.[4] .................. H03K 19/092; H03K 17/16; G06F 7/38

[52] U.S. Cl. .............................. 307/475; 340/825.83; 307/200 A; 307/443; 307/465; 307/469

[58] Field of Search ................ 365/168, 189; 330/257, 330/288; 307/200 A, 443, 465, 468–469, 473, 304; 340/825.83; 364/489–491; 357/42, 45

[56] References Cited

FOREIGN PATENT DOCUMENTS

| 0150423 | 8/1985 | European Pat. Off. ............. 357/42 |
| 0227843 | 9/1985 | Fed. Rep. of Germany ...... 307/475 |
| 0093406 | 7/1981 | Japan .................................. 330/257 |

OTHER PUBLICATIONS

Krieger, "Thermal Response of Integrated Circuit Input Devices to an Electrostatic Energy Pulse", *IEEE Transactions on Electron Devices*, vol. ED-34, No. 4, Apr. 87.

*Primary Examiner*—John S. Heyman
*Assistant Examiner*—M. R. Wambach
*Attorney, Agent, or Firm*—Wilbert Hawk, Jr.; Casimer K. Salys; Floyd A. Gonzalez

[57] ABSTRACT

A common cell for use as an input/output circuit in a CMOS integrated circuit having a P-channel transistor structure having a plurality of individual P-channel transistors, an N-channel transistor structure having a plurality of individual N-channel transistors and an I/O pad. The sources, drains and gates of the individual P-channel and N-channel transistors are connected to terminals. The various terminals and the I/O pad may be selectively connected in various ways to form various input/output circuits, as desired.

10 Claims, 6 Drawing Sheets

COMMON CELL I/O INTERFACE CIRCUIT

BACKGROUND OF THE INVENTION

The present invention is related to input/output (I/O) interface circuits for use with complementary-metal-oxide-silicon (CMOS) integrated circuits, and is more particularly related to I/O interface circuits which are formed by interconnecting various elements of a common cell which may be selectively connected to form selected input/output circuits as desired.

With the advent of semiconductor devices having a large number of transistors arranged in various configurations, it has become advantageous to design a number of basic cells having known characteristics which may be arranged as desired to form semiconductor devices. U.S. Pat. No. 4,412,237 issued Oct. 25, 1983 to Matsumura et al. for "Semiconductor Device" discloses a semiconductor device having a large number of basic cells. Each basic cell is comprised of first and second P-channel transistors and first and second N-channel transistors. The basic cells may be connected in a variety of ways to form logic arrays. The basic cells include a small space extending between both sides of the basic cells which, when arranged in an array, includes a field which may be utilized for interconnecting lines.

U.S. Pat. No. 4,161,622 issued July 17, 1979 to Malcolm et al. for "Standardized Digital Logic Chip" discloses standardized large scale integrated arrays of standard logic cells which may be interconnected as desired to implement a large variety of logic circuit designs. The pattern chosen for the layout of the standard logic cells provides very high cell density, very high utility ratios of the available cells by use of power and data interconnects within the cells.

U.S. Pat. No. 4,148,046 issued Apr. 3, 1979 to Hendrickson et al. discloses a field-effect transistor device having a number of unit cells for use in an analog signal switch.

U.S. Pat. No. 3,439,185 issued Apr. 15, 1969 to Gibson for "Logic Circuits Employing Field-Effect Transistors" discloses a logic circuit which employs field-effect transistors that can be made to implement a number of different logic functions in response to different combinations of control voltages applied to the logic circuits.

U.S. Pat. No. 3,588,848 issued June 28, 1971 to Van Beck for "Input-Output Control Circuit For Memory Circuit" discloses a circuit including field-effect transistors for use in a control circuit for MOS memory circuits.

SUMMARY OF THE INVENTION

There are two main advantages to the common cell approach to the design of an I/O circuit. One advantage is that the common cell provides similar parametric characteristics for the family of circuits. The other advantage is that changes can be implemented easily, since a change in the common cell will propagate through the whole family of circuits derived therefrom.

There are several parametric characteristics of interest in the I/O circuits used with integrated circuits. Various voltage levels should be consistent from output to output of I/O circuits. These voltages include the output low voltage (Vol), the output high voltage (Voh), the input low voltage (Vil), and the input high voltage (Vih). The latchup current should be in excess of 100 milliamps in either direction, and be consistent from circuit to circuit. The electrostatic discharge (ESD) voltage should be in excess of 2000 volts, and be consistent from circuit to circuit. The breakdown voltage in either direction should be 1 diode drop above or below the power supply voltage, and the resistance of the diode clamp should be the same for all circuits. As noted previously, these parameters will be consistent if the I/O circuits are all derived from a common cell design.

I/O circuits used in integrated circuits pose special problems. Since the I/O circuits interface the integrated circuit to the outside world, they are subject to static electricity encountered in handling. They are also subjected to excessive input signals which may lie outside the normal range of operation. These excessive input signals are cause for special concern as they may trigger latchup, which is a situation in which the parasitic 4-layer structure inherent in all bulk CMOS integrated circuits is turned on, and continues to draw current until the power supply is removed. This latchup current is usually limited by the power supply. If the power supply is capable of supplying a large enough current, the latchup current may destroy the circuit.

Susceptibility to latchup is measured by forcing a current, either into or out of pads, and measuring the maximum current which can be forced without incurring latchup. Since parasitic elements are involved in this phenomena, it is difficult to predict current sensitivity to this phenomena. Once a common cell I/O circuit has been designed, its susceptibility to latchup, having been measured, is known for each of the I/O circuits derived by the various configurations of that common cell.

Another measure of the quality of an I/O circuit is its ability to withstand surges of static electricity. This is usually measured by applying the voltage from a charged 100 picofarad capacitor through a 1500 ohm resistor to a circuit under test. This procedure results in a current in excess of 1 ampere which may be in either direction. The ability of an I/O circuit of an integrated circuit to withstand this treatment depends upon parasitic elements in the circuit design, and hence it is difficult to predict. A common I/O cell design thus results in consistent operation and uniform characteristics of all I/O circuits derived from the common cell.

As previously stated, changes made to the common cell design are automatically propagated throughout the family of circuits derived from that common cell design. This may be of a considerable advantage when a large number of I/O circuits are derived from a single common cell design. When providing semicustom integrated circuits to various customers, it is important to be able to guarantee the operating characteristics of these circuits. The common cell design approach disclosed herein reduces the amount of effort required to characterize the I/O design derived from a common cell since the characteristics of all derived circuits will be uniform within the limits of processing variations present from cell to cell.

It is thus an object of the present invention to provide a common input/output cell which includes a number of field-effect transistors having electrodes which may be selectively interconnected with an I/O pad for forming a select input/output circuit as desired.

It is another object of the present invention to provide a common input/output circuit which has been predesigned such that its characteristics are known, and which may be connected in a variety of patterns to provide selected input/output functions.

It is a further object of the present invention to provide a single common cell which may be connected in a variety of ways to satisfy a wide variety of customer specifications.

DESCRIPTION OF THE PREFERRED EMBODIMENTS

Figure 1:
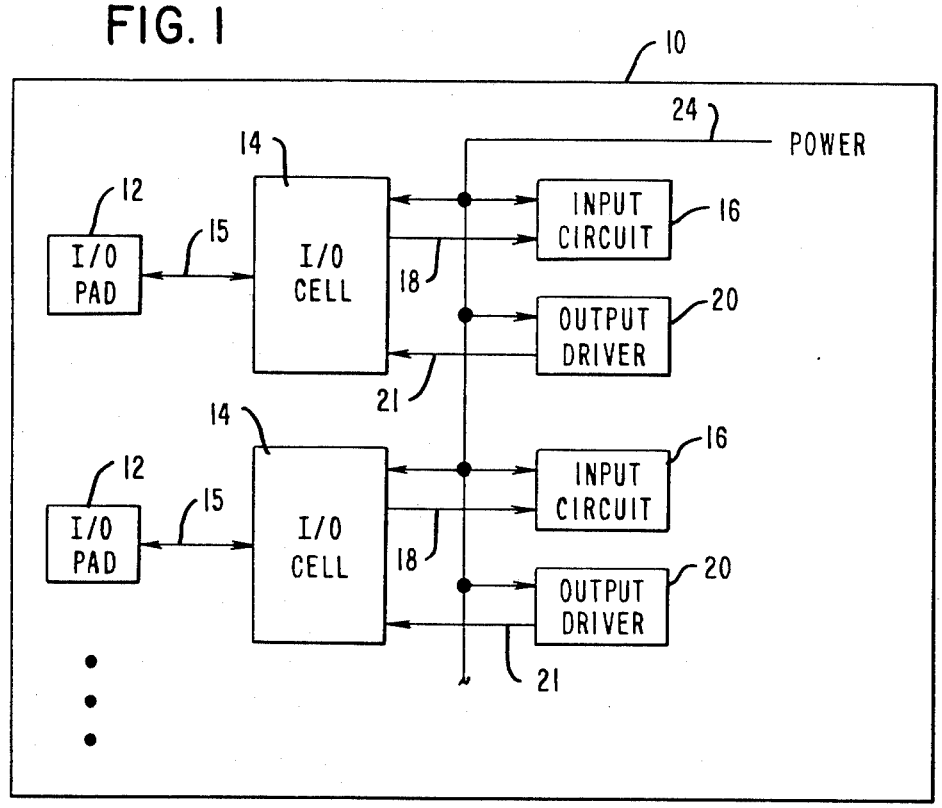
FIG. 1 is a diagrammatic representation of an integrated circuit chip having an I/O circuit derived from the common I/O cell of the present invention.

FIG. 1 is a diagrammatic representation of an integrated circuit chip 10 which may include a number of circuits for performing various desired functions, such as logic functions, storage functions, or control functions. The integrated circuit chip 10 includes a plurality of I/O pads 12 for providing signal communication with the integrated circuit 10. The I/O pads 12 may either receive input signals to be inputted into the circuitry of the integrated circuit chip 10, or for outputting output signals from the circuitry of the integrated circuit chip 10. Each I/O pad 12 is connected to an I/O cell 14 of the present invention, to be explained. The integrated circuit chip 10 may include input circuits 16 connected to the I/O cell circuits 14 by conductors 18 for receiving signals inputted into the integrated circuit chip 10. The integrated circuit chips 10 may also include output driver circuits 20 which supply signals over conductor 21 to the I/O cells 14 which cause the I/O cells 14 to place either high or low digital signals on I/O pads 12 to output digital data, as may be desired. It will be understood that an individual integrated circuit chip 10 may include only input circuits 16 or output circuits 20, or a mix of input circuits 16 and output circuits 20, which may vary from I/O cell to I/O cell depending upon the function and design of the individual integrated circuit chip 10. The integrated circuit chip 10 typically includes a power bus 24 for supplying power (Vdd and Vss) to the various circuits in the integrated circuit chip 10.

Figure 2:
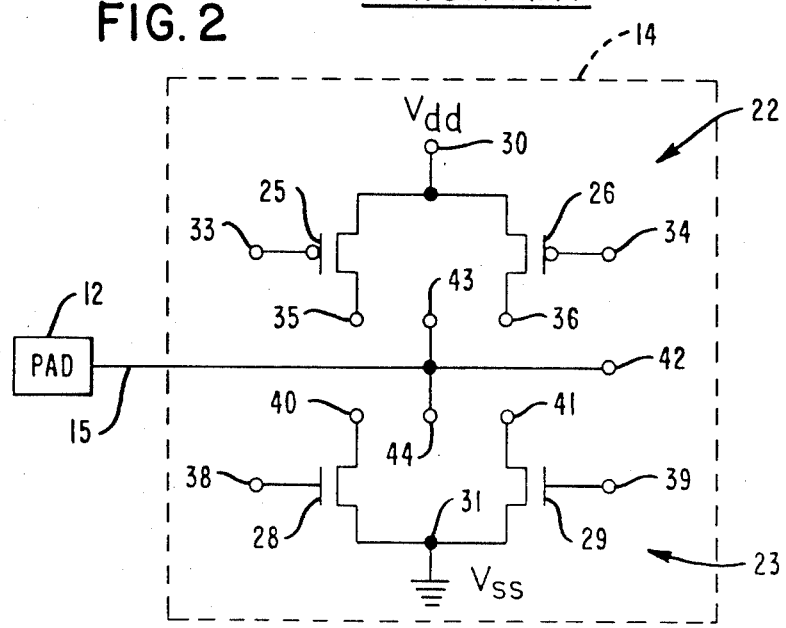
FIG. 2 is a schematic diagram showing the I/O common cell from which the I/O circuit of FIG. 1 is derived.

FIG. 2 is a schematic diagram showing the I/O pad 12, and the elements of the I/O common cell 14 of FIG. 1. The I/O common cell 14 includes a P-channel transistor structure 22 and an N-channel transistor structure 23. The P-channel transistor structure 22 includes a plurality of P-channel field-effect transistors shown as two transistors 25 and 26. The N-channel transistor structure 23 includes a plurality of N-channel field-effect transistors shown as two transistors, 28 and 29. The P-channel transistors 25 and 26 are arranged in the P-channel transistor structure 22 on one side of the conductor 15, and the N-channel transistors 28 and 29 are arranged in the N-channel transistor structure 23 on the other side of conductor 15. The sources of the P-channel transistors 25 and 26 are tied together to a common terminal 30 for receiving the voltage Vdd. The voltage Vdd is supplied over the power bus 24 to the I/O common cell 14, and typically is a nominal +5 volts. The sources of the N-channel transistors 28 and 29 are tied to a common terminal 31, which is connected to a voltage Vss, which in this case is shown as grounded. It will be understood that Vss is usually a nominal 0 volts. The gates of the P-channel transistors 25 and 26 terminate on gate terminals 33 and 34, and the drains of the P-channel transistors 25 and 26 are connected to P-channel drain terminals 35 and 36. The gates of the N-channel transistors 28 and 29 are connected to N-channel gate terminals 38 and 39, and the drains of the N-channel transistors 28 and 29 are connected to N-channel drain terminals 40 and 41 respectively. The conductor 15 from the I/O pad 12 terminates on an input terminal 42. A pair of common drain terminals 43 and 44 are connected to conductor 15 as shown. It will be understood that the various terminals of the P-channel transistor structure 22 and the N-channel transistor structure 23 may be interconnected to form various I/O circuits, as desired.

Figure 3:
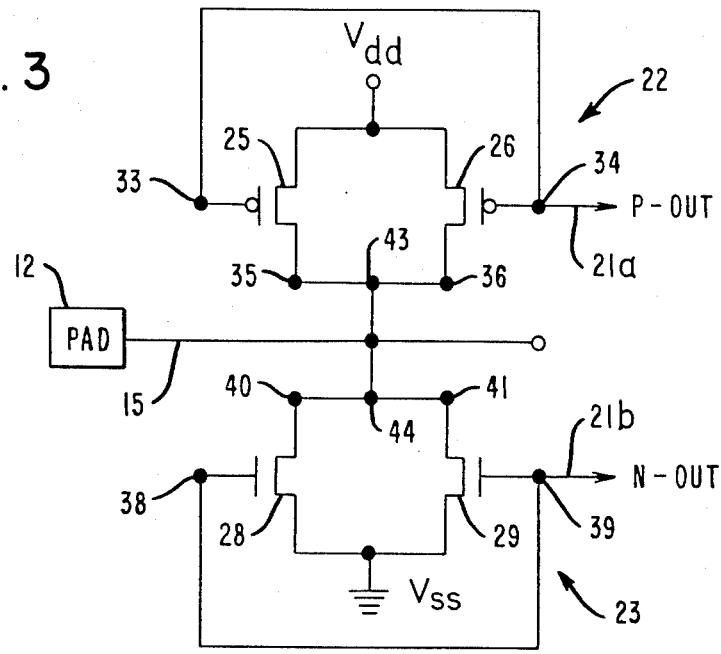
FIG. 3 is a schematic diagram of a tri-state output circuit derived from the common I/O cell of FIG. 2.

FIG. 3 is a schematic diagram of the common cell I/O circuit of FIG. 2 in which the various terminals of the P-channel transistor structure 22 and the N-channel transistor structure 23 are connected as a tri-state output circuit. The drain terminals 35 and 36 of the P-channel transistors 25 and 26 respectively are tied together and connected to the common drain terminal 43. The drain terminals 40 and 41 of the N-channel transistors 38 and 39 respectively of the N-channel transistor structure 23 are tied together and connected to the common drain terminal 44. As mentioned previously, the common drain terminals 43 and 44 are both connected to the conductor 15 leading to the I/O pad 12. The gates 33 and 34 of the P-channel transistors 25 and 26 respectively are tied together and connected to a conductor 21A leading from the output driver circuit 20 of FIG. 1 for receiving output pulses from the output driver circuit 20. Similarly, the gates 38 and 39 of the N-channel transistors 28 and 29 respectively are tied together and connected to a conductor 21B from the output driver circuit 20 of FIG. 1. A low P-out signal on the conductor 21A turns on the P-channel transistors 25 and 26 to place a high on the I/O pad 12, and a high N-out signal on conductor 21B turns on the N-channel transistors 28 and 29 to place a low on the I/O pad 12. The low P-out signal on conductor 21A and the high N-out signal on conductor 21B are non-overlapping, output signals provided by the output driver circuit 20 to drive the I/O pad 12, as desired.

Figure 4:
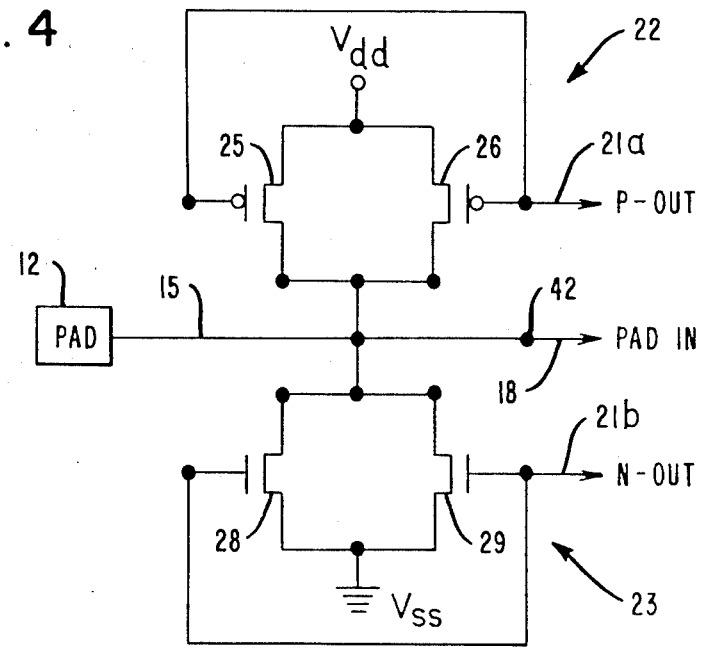
FIG. 4 is a schematic diagram of a bi-directional I/O circuit derived from the common I/O cell of FIG. 2.

FIG. 4 is a schematic diagram of the connections of the circuit of FIG. 2 which forms a bi-connections directional I/O circuit. The circuit of FIG. 4 is the same as the circuit of FIG. 3 except that the input terminal 42 is connected to the conductor 18 of the input circuit 16 of FIG. 1. Thus input signals placed on the I/O pad 12 are inputted into the input circuit 16 of the integrated circuit chip 10 of FIG. 1 via the conductor 15, the input terminal 42, and the conductor 18. Thus, pad in signals may be received and the input circuit 16, and p-out signals and n-out signals may be outputted by the output driver circuit 20 to drive the output pad 12 as previously explained.

Figure 5:
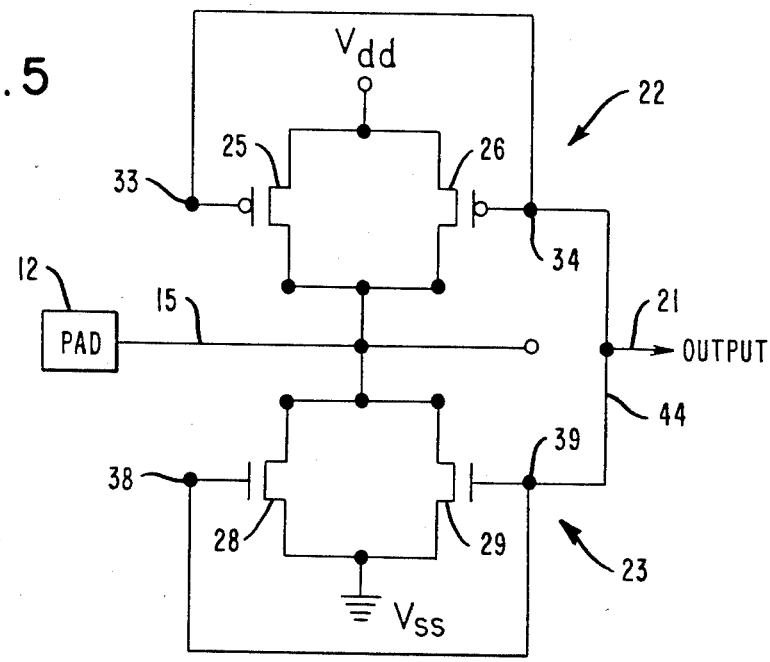
FIG. 5 is a schematic diagram of an output circuit derived from the common I/O cell of FIG. 2.

FIG. 5 is a schematic diagram of the I/O circuit of FIG. 2 connected as an output circuit. The gate terminal 34 of the p-channel transistor structure 22 is connected to the gate terminal 39 of the n-channel transistor structure 23 by conductor 44. The output 21 of the output driver 20 of FIG. 1 is connected to the conductor 44 such that output signals OUTPUT placed on conductor 21 by the output driver circuits 20 are placed on the gate terminals 34 and 39. As discussed in connection with FIG. 3, the gate terminal 34 is also connected to the gate terminal 33. The gate terminal 39 is connected to the gate terminal 38. Thus a low output signal on conductor 21 will turn on the p-channel transistors 25 and 26 of the p-channel transistor structure 22, and a high output signal on conductor 21 will turn on the n-channel transistors 28 and 29 of the n-channel transistor structure 23, thus driving the I/O pad 12 for outputting digital signals.

Figure 6:
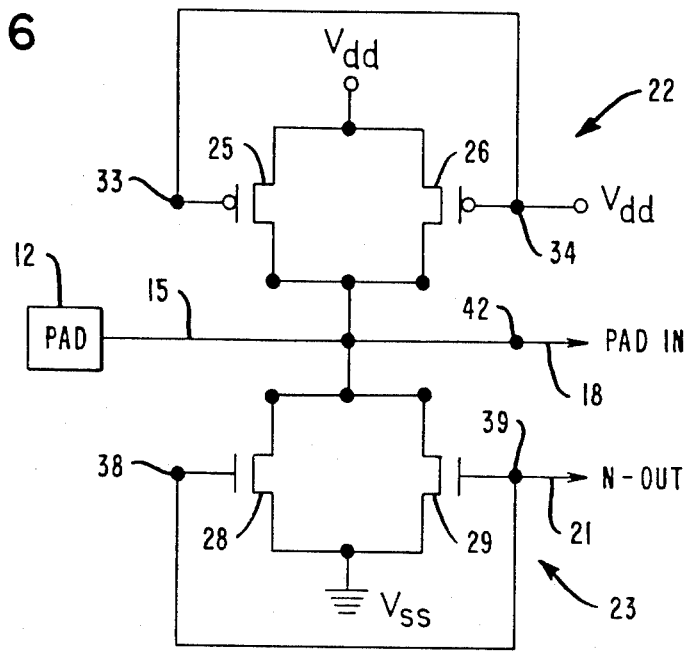
FIG. 6 is a schematic diagram of a bi-directional open drain output circuit derived from the common cell I/O circuit of FIG. 2.

FIG. 6 is a schematic diagram of the common cell I/O circuit of FIG. 2 wherein the I/O circuit is connected to form a bi-directional open drain output circuit. In the circuit of FIG. 6, the gates 33 and 34 of the p-channel transistor structure 22 are connected to the voltage Vdd removing the p-channel transistor structure 22 from the circuit. The gates 38 and 39 of the n-channel transistor structure 23 are connected to the output conductor 21 of the output driver circuit 20 of FIG. 1. The input terminal 42 of the circuit of FIG. 6 is connected to conductor 18 of the input circuit 16 of FIG. 1 for receiving input signals. In the circuit of FIG. 6, the n-channel transistor structure 23 acts as an open drain output circuit.

Figure 7:
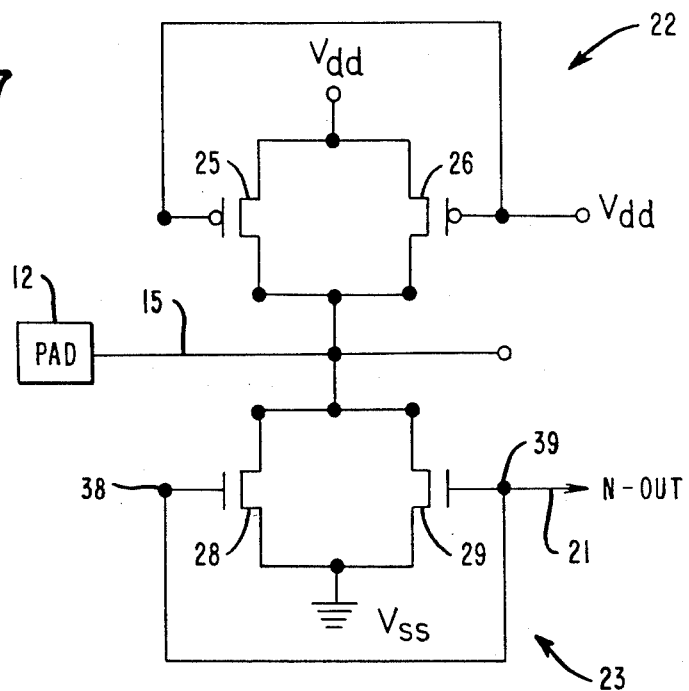
FIG. 7 is a schematic diagram of an open drain output circuit derived from the common I/O circuit of FIG. 2.

FIG. 7 is a schematic diagram of the I/O circuit 14 of FIG. 2 connected as an open drain output circuit. The circuit of FIG. 7 is the same as the circuit of FIG. 6 except that the input terminal 42 is not connected to the input line 18. Thus, the n-channel transistor structure 22 acts as an open drain output circuit. The circuit of FIG. 7 does not include circuitry for receiving an input signal for the integrated circuit chip 10 of FIG. 1.

Figure 8:
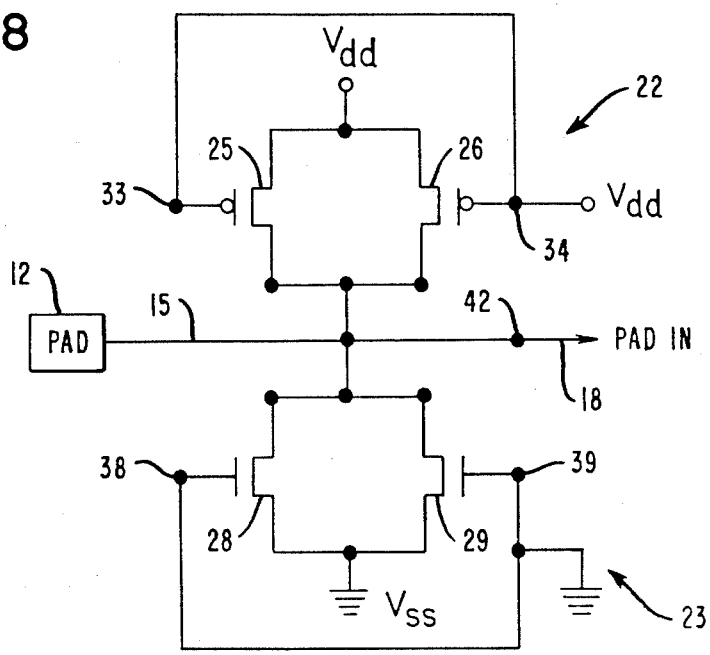
FIG. 8 is an input circuit derived from the common I/O cell of FIG. 2.

Connecting the terminals of the common cell I/O circuit 14 of FIG. 2 as shown in FIG. 8 results in a standard input circuit. The gate terminals 38 and 39 of the n-channel transistor structure 23 are connected to the voltage Vss, and the gate terminals 33 and 34 of the p-channel transistor structure 22 are connected to the voltage Vdd.

It will be understood that the p-channel transistors 25 and 26 of the p-channel transistor structure 22 are representative only and could be replaced by a plurality of p-channel transistors. Likewise, the n-channel transistors 28 and 29 of the n-channel transistor structure 23 are representative only, and could be formed by a plurality of n-channel transistors. It will also be understood that the p-channel transistor structure 22 and the n-channel transistor structure 23 form detective diodes for electrostatic discharges.

Figure 9:
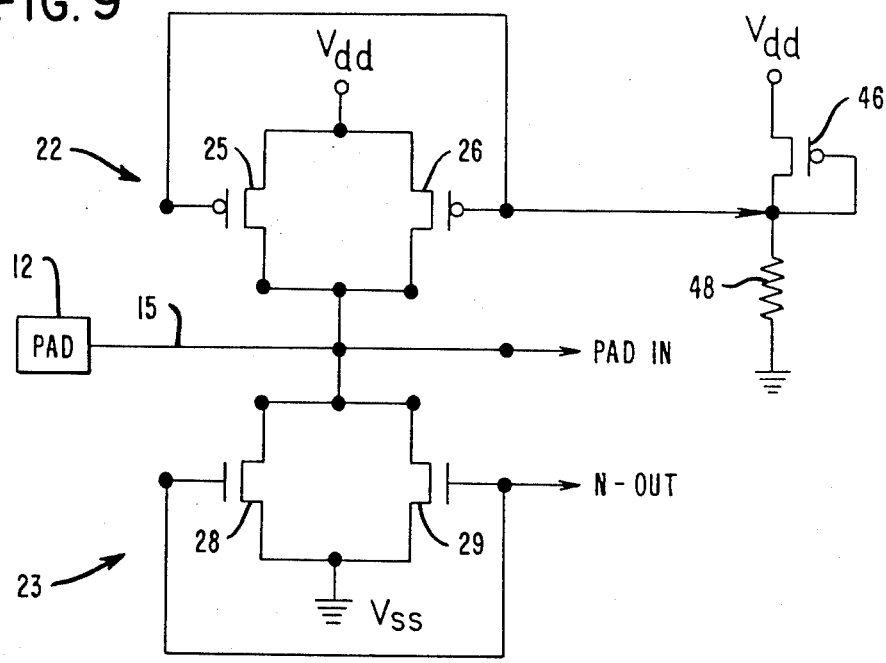
FIG. 9 is an open drain bi-directional output circuit with a current source derived from the common I/O circuit of FIG. 2 with a current mirror added.

FIG. 9 is a schematic diagram of the common cell I/O circuit 14 of FIG. 2 wherein a reference has been added to the p-channel transistor structure 22 for determining the current output of the I/O circuit 14. The current reference shown by way of example in FIG. 9 is a p-channel transistor 46 whose source is connected to the voltage Vdd, its drain connected to Vss through a resistor 48, and its gate connected to its drain. The resistor 48 is sized such that the current level of the transistor 46 is approximately 1/10 of the nominal output of the current of the I/O cell 14 of FIG. 9. The configuration shown in FIG. 9 is an open drain bi-directional output circuit with a current source. It will be understood that other references rather than the current mirror shown in FIG. 9 could be used for setting a reference for the threshold of the p-channel transistors of p-channel transistor structure 22. It will further be understood that a similar current mirror could be included in each of the previous configurations shown wherein an output current is desired.

Figure 10:
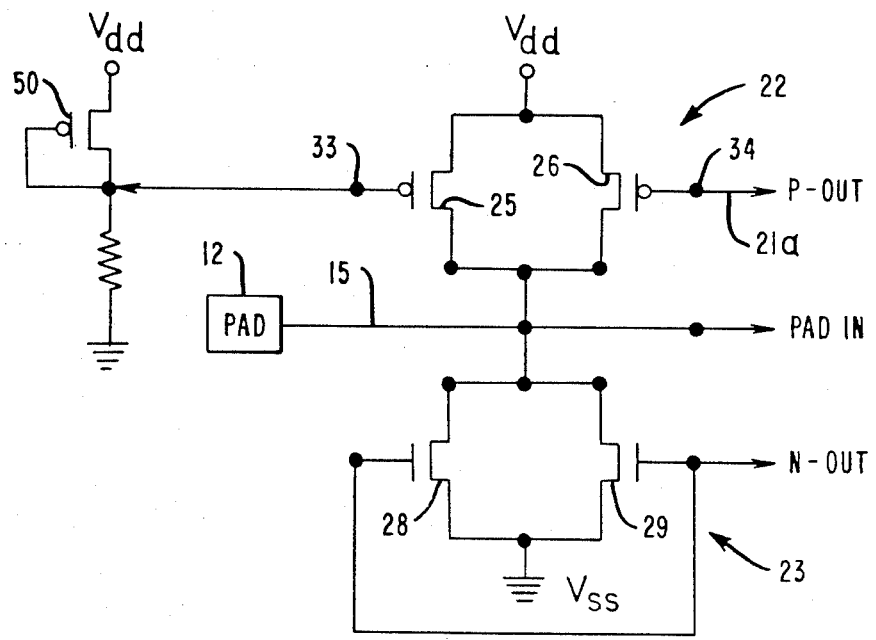
FIG. 10 is a bi-directional output circuit derived from the common cell I/O circuit of FIG. 2 having a pull-up transistor and a current source.

FIG. 10 is a schematic diagram of the I/O cell 14 of FIG. 2 wherein the p-channel transistors 25 and 26 of the p-channel transistor structure 22 have been separated. The gate terminal 34 of the p-channel transistor 26 is connected to the line 21A, as previously discussed in connection with FIG. 3, and a current mirror including a p-channel transistor 50 connected to the gate terminal 33 of the p-channel transistor 25. Thus, the p-channel transistor 25 provides a current source for the output of the I/O cell 14 of FIG. 10, and the p-channel transistor 26 provides pull-up for the I/O circuit of FIG. 10.

Figure 11:
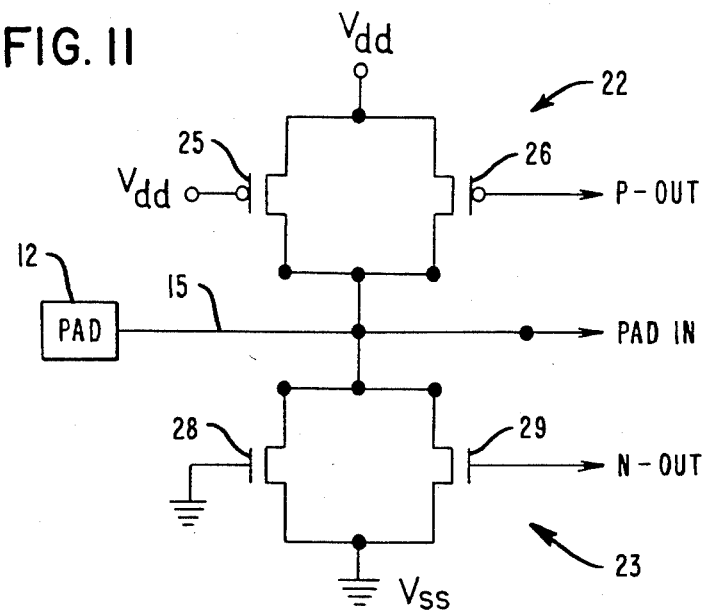
FIG. 11 is a two milliamp bi-directional output circuit derived from the common cell I/O circuit of FIG. 2.

The double transistor configuration of the p-channel transistor structure 22 and the n-channel transistor structure 23 is needed as a minimum for adequate ESD protection. The double transistor configuration shown in FIGS. 2–10 are adequate for a 4 milliamp n-channel output device. If only a 2 milliamp n-channel output device is needed, the configuration can be changed to that shown in FIG. 11, which separates p-channel transistors 25 and 26 in the p-channel transistor structure 22, and n-channel transistors 28 and 29 in the n-channel transistor structure 23. The gate of the p-channel transistor 25 is connected to Vdd, and the gate of the n-channel transistor 28 is connected to Vss. In the configuration of FIG. 11, p-channel transistor 26 provides pull-up, n-channel transistor 29 provides pull-down, and p-channel transistor 25 and n-channel transistor 28 provide ESD protection.

The p-channel transistors 25 and 26, and the n-channel transistors 28 and 29 may be similarly separated in the embodiments shown in FIGS. 3–7, where appropriate, to provide a 2 milliamp output circuit with ESD protection.

Figure 12:
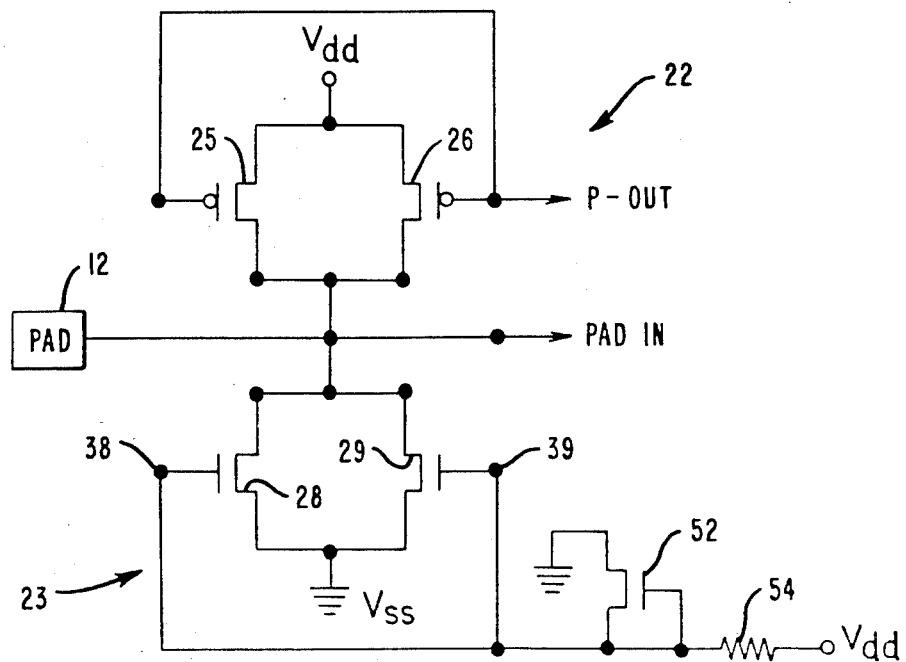
FIG. 12 is a bi-directional open drain output circuit derived from the common cell I/O circuit of FIG. 2 having a current mirror added.

FIG. 12 is a schematic diagram of a bi-directional open drain output circuit using a current mirror which sinks current instead of sourcing it. The current mirror includes an n-channel transistor 52 having its drain and gate connected to the gate terminals 38 and 39 of the n-channel transistor structure 23, and its source connected to Vss. The drain and gate of the n-channel transistor 52 is also connected to Vdd through a resistor 54. The current mirror formed by n-channel transistor 52 sets a reference for the n-channel transistors 28 and 29 of the n-channel transistor structure 23, and is shown as an example. Other references may be used to sink current.

These circuits are not intended to be exhaustive, but rather to show some of the possibilities for connections to a common I/O cell 14 of FIG. 2. A properly designed common cell can be used in a wide number of applications, which will reduce the number of unique cells required for cell library or gate array applications. In the case of gate arrays, this design may prove to be even more useful, since the array is fixed in the design of several of the mask layers, and specialization may be carried out only in the interconnect layers.

An example was given of a design which could be used at both the 4 milliamp current level, and the two milliamp current level. Higher current levels may be provided for by adding additional P-channel transistors in parallel with P-channel transistors 25 and 26, and by adding additional N-channel transistors in parallel with N-channel transistors 28 and 29.

This design was originally intended for a three micron cell library. As dimensions are scaled down to two microns and below, the current level supported by an I/O cell which will fit into the minimum pad spacing dimension increases. For a two micron library, an I/O cell supporting 8 milliamps, for instance, is feasible. This cell can be constructed using a pair of eight interdigitated output devices which can then be connected up in a variety of ways.

The examples herein have only two output devices for the pullup and two for the pull down. If eight devices were used instead, the number of possibilities for their hookups becomes enormous. They could be used both for current sources, and driven output devices at various current levels, with any left over sections tied off to the power supply rails.

The basic minimum cell can be included as a common cell, with all of the variations being included on an upper level. This upper level can be edited to either add, or subtract elements of the design.

This procedure can be automated with a program, which will run on the graphics design system. This program receives a set of parameters from the layout program, which will specify the proper set of connections for the various parts of the common cell. Each specialized connection can be placed in a separate cell, and each of these cells can be placed at the origin of the common cell. The specialization program receives a set of parameters from the net list, and converts these parameters into a set of option cells which are placed at the origin of the common I/O cell. The result is a specialized I/O cell for the particular connection to the circuit undergoing design.

This procedure will allow for many possible I/O circuits to be constructed, without requiring a separate symbol for each circuit in the schematic entry system. A common symbol can be used with a naming convention, and a set of parameters to specify the particular connections to be used.

I claim:

1. A common cell for use as an input/output circuit in an integrated circuit comprising:
   an I/O pad;
   a P-channel transistor structure having a plurality of individual P-channel transistors;
   an N-channel transistor structure having a plurality of individual N-channel transistors;
   a Vdd terminal connected to the sources of the individual P-channel transistors of the P-channel transistor structure;
   a P-channel drain terminal connected to the drains of the individual P-channel transistors of the P-channel transistor structure;
   a plurality of P-channel gate terminals, each connected to one of the gates of the individual P-channel transistors of the P-channel transistor structure;
   a Vss terminal connected to the sources of the individual N-channel transistors of the N-channel transistor structure;
   an N-channel drain terminal connected to the drains of the individual N-channel transistors of the N-channel transistor structure and to said P-channel drain terminal; and
   a plurality of N-channel gate terminals, each connected to one of the gates of the individual N-channel transistors of the N-channel transistor structure;
   said I/O pad, P-channel drain terminal, P-channel gate terminals, N-channel drain terminal, and N-channel gate terminals being selectively connected, as desired, to form selected input/output circuit configurations having electrostatic discharge protection.

2. The common cell of claim 1 wherein:
   the P-channel drain terminal is connected to the I/O pad;
   the N-channel drain terminal is connected to the I/O pad;
   the P-channel gate terminals are commonly connected to a P-channel output circuit of the integrated circuit for receiving P-channel output signals;
   the N-channel gate terminals are commonly connected to an N-channel output circuit of the integrated circuit for receiving N-channel output signals.

3. The common cell of claim 2 further comprising an input terminal connected to the I/O pad, said input terminal being connectable to an input circuit of the integrated circuit wherein input signals imposed on said I/O pad may be transmitted to said input terminal for being inputted into the input circuit of the integrated circuit.

4. The common cell of claim 1 wherein the P-channel drain terminal is connected to the I/O pad, the N-channel drain terminal is connected to the I/O pad, and the P-channel gate terminals and the N-channel gate terminals are tied together to a common output terminal for receiving output signals from an output circuit of the integrated circuit for placing output signals on the I/O pad.

5. The common cell of claim 1 wherein the P-channel drain terminal is connected to the I/O pad, the N-channel drain terminal is connected to the I/O pad, the P-channel gate terminals are commonly connected to said Vdd terminal and the N-channel gate terminals are commonly connected to an output terminal for connection with an output circuit in the integrated circuit forming a bidirectional open drain output circuit.

6. The common cell of claim 5 further comprising an input terminal connected to said I/O pad, said input terminal being arranged for connection to an input circuit in the integrated circuit wherein input signals placed on said I/O pad are transmitted by said input terminal to the input circuit of the integrated circuit.

7. The common cell of claim 2 further comprising a reference connected to said P-channel gate terminal.

8. The common cell of claim 7 wherein said reference is a current mirror.

9. The common cell of claim 2 further comprising a reference connected to said N-channel gate terminal.

10. The common cell of claim 9 wherein said reference is a current mirror.

* * * * *